(12) United States Patent
Le et al.

(10) Patent No.: US 11,011,550 B2
(45) Date of Patent: May 18, 2021

(54) SELF-ALIGNED TOP-GATED NON-PLANAR OXIDE SEMICONDUCTOR THIN FILM TRANSISTORS

(71) Applicant: Intel Corporation, Santa Clara, CA (US)

(72) Inventors: Van Le, Beaverton, OR (US); Abhishek Sharma, Hillsboro, OR (US); Gilbert Dewey, Hillsboro, OR (US); Ravi Pillarisetty, Portland, OR (US); Shriram Shivaraman, Hillsboro, OR (US); Tahir Ghani, Portland, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/461,697

(22) PCT Filed: Dec. 28, 2016

(86) PCT No.: PCT/US2016/069003
§ 371 (c)(1),
(2) Date: May 16, 2019

(87) PCT Pub. No.: WO2018/111310
PCT Pub. Date: Jun. 21, 2018

(65) Prior Publication Data
US 2019/0355725 A1 Nov. 21, 2019

Related U.S. Application Data

(63) Continuation of application No. PCT/US2016/066416, filed on Dec. 13, 2016.

(51) Int. Cl.
*H01L 27/12* (2006.01)
*H01L 27/108* (2006.01)
(Continued)

(52) U.S. Cl.
CPC .... *H01L 27/1229* (2013.01); *H01L 27/10805* (2013.01); *H01L 27/10873* (2013.01);
(Continued)

(58) Field of Classification Search
CPC .......... H01L 27/10805; H01L 27/1229; H01L 29/4908; H01L 29/78651; H01L 29/78693;
(Continued)

(56) References Cited

U.S. PATENT DOCUMENTS 5,995,187 A  11/1999 Wakagi et al.
6,271,542 B1  8/2001 Emma et al.
(Continued)

OTHER PUBLICATIONS

International Preliminary Report on Patentability, dated Jun. 27, 2019 for PCT Patent Application No. PCT/US2016/69003.
(Continued)

*Primary Examiner* — Edward Chin
(74) *Attorney, Agent, or Firm* — Green, Howard & Mughal LLP

(57) ABSTRACT

Non-planar thin film transistors (TFTs) incorporating an oxide semiconductor for the channel material. Memory devices may include an array of one thin film transistor and one capacitor (1TFT-1C) memory cells. Methods for fabricating non-planar thin film transistors may include a sacrificial gate/top-gate replacement technique with self-alignment of source/drain contacts.

12 Claims, 15 Drawing Sheets

(51) Int. Cl.
  *H01L 29/22* (2006.01)
  *H01L 29/423* (2006.01)
  *H01L 29/66* (2006.01)
  *H01L 29/786* (2006.01)
  *H01L 29/49* (2006.01)

(52) U.S. Cl.
  CPC ........ *H01L 27/124* (2013.01); *H01L 27/1281* (2013.01); *H01L 29/2206* (2013.01); *H01L 29/42384* (2013.01); *H01L 29/4908* (2013.01); *H01L 29/66757* (2013.01); *H01L 29/786* (2013.01); *H01L 29/78651* (2013.01); *H01L 29/78693* (2013.01)

(58) Field of Classification Search
  CPC ........... H01L 27/10873; H01L 29/2206; H01L 29/42384; H01L 29/66757; H01L 29/786; H01L 29/24; H01L 29/7869
  See application file for complete search history.

(56) References Cited

U.S. PATENT DOCUMENTS

| | | | |
|---|---|---|---|
| 6,319,761 | B1 | 11/2001 | Zhang et al. |
| 6,787,914 | B2 | 9/2004 | Fortin |
| 2003/0201442 | A1 | 10/2003 | Makita et al. |
| 2004/0065913 | A1 | 4/2004 | Shimada et al. |
| 2005/0156217 | A1 | 7/2005 | Shimada et al. |
| 2006/0003503 | A1 | 1/2006 | Yang et al. |
| 2007/0007571 | A1 | 1/2007 | Lindsay et al. |
| 2009/0149012 | A1 | 6/2009 | Brask et al. |
| 2010/0103159 | A1 | 4/2010 | Leon |
| 2010/0117147 | A1 | 5/2010 | Kim et al. |
| 2011/0147856 | A1 | 6/2011 | Sasaki et al. |
| 2011/0266537 | A1 | 11/2011 | Ye |
| 2013/0248852 | A1 | 9/2013 | Yokozeki |
| 2014/0183525 | A1 | 7/2014 | Kaneko et al. |
| 2014/0191237 | A1 | 7/2014 | Hekmatshoartabari et al. |
| 2014/0377906 | A1* | 12/2014 | Lin ................... H01L 27/1225 438/104 |
| 2015/0255139 | A1 | 9/2015 | Atsumi et al. |
| 2015/0263176 | A1 | 9/2015 | Cheng |
| 2015/0303311 | A1 | 10/2015 | Yu et al. |
| 2015/0357480 | A1 | 12/2015 | Yu et al. |
| 2016/0035755 | A1 | 2/2016 | Li et al. |
| 2016/0086802 | A1 | 3/2016 | Hong et al. |
| 2017/0186783 | A1 | 6/2017 | Hu |
| 2018/0004883 | A1 | 1/2018 | Yuan et al. |
| 2018/0158843 | A1 | 6/2018 | Lius et al. |
| 2018/0301380 | A1* | 10/2018 | Or-Bach ............. H01L 21/845 |
| 2020/0350412 | A1* | 11/2020 | Ku ......................... H01L 29/22 |

OTHER PUBLICATIONS

International search report and Written Opinion for International Patent Application No. PCT/US2016/069003, dated Jul. 28, 2017.

\* cited by examiner

SELF-ALIGNED TOP-GATED NON-PLANAR OXIDE SEMICONDUCTOR THIN FILM TRANSISTORS

CLAIM FOR PRIORITY

This application claims priority to PCT Patent Application Serial No. PCT/US2016/066416, filed on 13 Dec. 2016, titled "PASSIVATION DIELECTRICS FOR OXIDE SEMICONDUCTOR THIN FILM TRANSISTORS", and which is incorporated by reference in entirety.

BACKGROUND

Thin-film transistors (TFTs) are a class of field-effect transistors (FETs) in which the channel material is a deposited thin film rather than a monocrystalline material. A common application of TFT technology is liquid crystal displays (LCDs), but TFTs are also advantageous in other applications as the thin film deposition processes employed in TFT fabrication can be relatively low (e.g., below 450° C.), allowing TFTs to be inserted within layers of interconnect metallization of the type that is typically formed only after higher-temperature processing is completed in conventional silicon CMOS FET fabrication technology. TFTs can be made using a wide variety of semiconductor materials, such as silicon, germanium, silicon-germanium, as well as various oxide semiconductors (a.k.a. semiconducting oxides) including metal oxides like indium gallium zinc oxide (IGZO).

TFTs typically utilize planar transistor architectures, such as a back-gate, top-contact topology. In such a design, a gate dielectric film and channel semiconductor film are deposited over a gate electrode that is embedded within a surrounding dielectric material. Contacts are then landed on channel semiconductor film. While such TFT architecture has proven successful for some applications, such as LCD backplane circuitry, more advanced architectures may enable devices heretofore unknown.

BRIEF DESCRIPTION OF THE DRAWINGS

The material described herein is illustrated by way of example, and not by way of limitation, in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
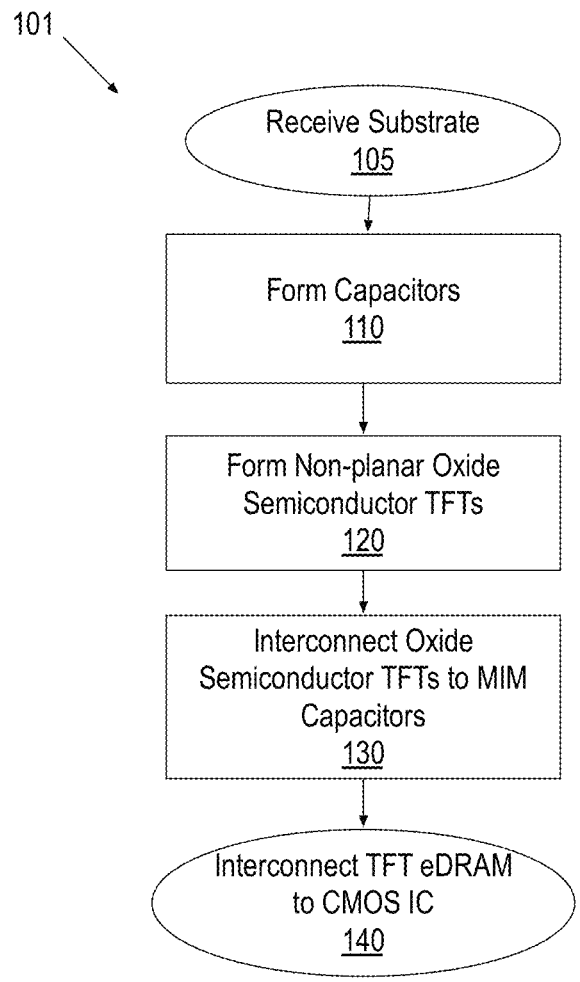
FIG. 1 is a flow diagram illustrating methods for fabricating a memory including non-planar 1TFT-1C cells suitable for eDRAM applications, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one" of or "one or more of" can mean any combination of the listed terms. For example, the phrase "at least one of A, B or C" can mean A; B; C; A and B; A and C; B and C; or A, B and C.

Non-planar thin film transistors incorporating an oxide semiconductor for the channel material are described herein. Memory devices including an array of one thin film transistor and one capacitor (1TFT-1C) memory cells are also described. For some such devices, the write transistor coupled to a terminal of a capacitor is a non-planar thin film transistor comprising an oxide semiconductor channel. Methods for fabricating non-planar thin film transistors suitable for 1TFT-1C arrays, as well as other devices and applications, are also described.

Embedded memory may be designed into integrated circuits (ICs). Embedded memory may either be monolithically integrated with an IC (i.e., both memory and the IC fabricated on the same chip), or may be integrated with an IC as a multi-chip module (MCM). For all embedded memory applications, reducing the overall memory array footprint is very important for aerial density scaling and cost reduction. One form of embedded memory is embedded dynamic random access memory (eDRAM). The architecture of eDRAM is based on a 1T-1C cell that includes a write transistor and a storage capacitor. For some exemplary embodiments herein, the transistor of a 1T-1C cell is a metal oxide TFT rather than a monocrystalline silicon-based transistor (e.g., MOSFET). One advantage of a TFT-based 1T-1C cell is that the TFT can be fabricated within the metal interconnect layers that are formed by "backend" processes of an IC fabrication flow. Because a metal-insulator-metal (MIM) capacitor may also be fabricated within the metal interconnect layers, TFT technology can make it possible to fabricate an entire DRAM array within the backend metal interconnect layers.

As such, eDRAM fabrication becomes independent of the monocrystalline substrate typically employed in the fabrication of CMOS ICs. TFT-based eDRAM embodiments described herein may therefore advance MCM or monolithic integration of eDRAM. For example, TFT-based eDRAM embodiments described herein may reduce the footprint of a DRAM array by moving the write transistors off the substrate so as to be vertically integrated with the capacitors. In some further embodiments, multiple TFT write transistors are stacked (e.g., multiple metal oxide films) between interlayer dielectric levels. This 3-D TFT stacking allows for higher density without sacrificing lateral area. In some such embodiments, the capacitors may be machined into the substrate while the TFTs are fabricated above the capacitors. Alternatively, the capacitors may be fabricated within metal interconnect levels while the TFTs are fabricated within the same and/or other interconnect levels. TFT-based eDRAM embodiments described herein may also facilitate monolithic IC and eDRAM integration by allowing an IC (e.g., having any CMOS architecture) to occupy area of a monocrystalline substrate while the eDRAM array (including many 1TFT-1C cells) is fabricated within interconnect levels formed over the IC.

TFT performance depends at least in part on the composition of the semiconductor employed as the transistor channel material. Exemplary embodiments described herein employ an oxide semiconductor for at least the channel material. For such embodiments, wide band gap metal oxide channel material offer low leakage. These low-leakage TFTs will therefore allow higher retention rates at higher memory density.

Semiconducting properties vary with the oxide semiconductor composition and microstructure. An oxide semiconductor thin film can be amorphous (i.e., having no structural order), or polycrystalline (e.g., having micro-scale to nano-scale crystal grains). Notably, oxide semiconductor TFT architectures described herein offer the advantage of low off-state leakage. In some exemplary embodiments, the oxide semiconductor transistor displays lower off-state leakage than a comparably dimensioned silicon-based field effect transistor (FET). Hence, in addition to enabling a DRAM array to move off a monocyrstalline substrate, oxide semiconductor TFT-based DRAM embodiments described herein may include lower off-state leakage write transistors that further enable a reduction in capacitor size since the capacitor discharge rate associated with off-state leakage of the write transistor is reduced. With smaller capacitor size, the 1T-1C cell area and/or cell cost may be reduced.

In accordance with some embodiments, oxide semiconductor TFTs employ a non-planar, multi-gate architecture. In contrast to planar transistor architectures, the non-planar TFT embodiments described herein improve transistor on-state current/area, and/or reduce gate length ($L_g$) variation, and/or reduce short channel effects to enhance performance at scaled dimensions. FIG. 1 is a flow diagram illustrating methods for fabricating a memory including non-planar 1TFT-C cells suitable for eDRAM applications. Methods 101 begin with receiving a substrate at operation 105. The substrate may have any composition, such as, but not limited to, monocrystalline silicon (Si), silicon-carbide (SiC), sapphire, III-V compound semiconductor (e.g., GaAs). Alternative substrates include germanium (Ge), silicon-germanium (SiGe), semiconductor on insulator (SOI), polymers, glasses, or any other material known to be suitable for TFT-based memory devices.

Methods 101 continue at operation 110 where capacitors are formed. The capacitors may have any architecture and may be fabricated with any fabrication process(es) known to be suitable for a DRAM capacitor. In some embodiments, metal-insulator-metal (MIM) capacitors are fabricated into the substrate received at operation 105, for example by etching an array of structures into a surface of the substrate and lining these structures with a metal-insulator-metal thin film stack that is then patterned into a capacitor array. In other embodiments, a metal-insulator-metal (MIM) capacitor array is fabricated over the substrate, for example by depositing a metal-insulator-metal thin film stack over a dielectric material, and patterning the stack into a capacitor array.

Methods 101 continue at operation 120 where non-planar oxide semiconductor TFTs are fabricated, for example over, or adjacent to, the capacitors formed at operation 120. The order of operations 110 and 120 may also be swapped such that the non-planar TFTs are fabricated first and capacitors are fabricated over, or adjacent to, the TFTs. The non-planar TFTs fabricated at operation 120 include an oxide semiconductor channel capacitively controllable with a 3D gate (e.g., dual-gate, tri-gate, omega-gate, wrap-around gate, or other multi-gate structure). At operation 130, the non-planar oxide semiconductor TFTs fabricated at operation 120 are interconnected to the capacitors fabricated at operation 110. In some exemplary embodiments, one terminal of a non-planar oxide semiconductor TFT, such as a source/drain terminal, is interconnected to one capacitor electrode. One or more interconnect levels may be fabricated over one or more of the TFTs and capacitors to complete their interconnection. Other terminals of the TFTs may also be coupled to each other and/or to chip terminals (e.g., top-level metallization pads) that can be further interconnected to off-chip destinations.

Following operation 130, the 1C-1TFT DRAM device is substantially complete. Methods 101 may continue at operation 140 where the 1C-1TFT DRAM device is interconnected to CMOS-based integrated circuitry with the output of methods 101 being an IC with eDRAM. The IC may be, a logic IC, a power IC, or a system-on-chip (SOC), for example. A logic IC in some examples is a microprocessor, such as a central processor, graphics, or heterogeneous processor. For MCM embodiments, operation 140 may implement any chip-to-chip interconnect architecture. For example, flip-chip ball grid array packages (e.g., FCBGA), package-on-package (PoP), system-in-package (SiP), or the like may be practiced at operation 140 to electrically interconnect a 1C-1TFT DRAM device with a semiconductor die or chip including an IC. For monolithic embodiments, operation 140 may include fabricating back-end-of-line (BEOL) metallization that couples various terminals of the non-planar TFTs fabricated at operation 120 to front-end-of-line (FEOL) logic circuitry fabricated on the substrate received at operation 105. In some such embodiments, there may be little distinction between operations 130 and 140 as the various interconnect levels fabricated may concurrently interconnect the TFTs to capacitors and CMOS circuitry present on the substrate. In some exemplary embodiments, both the CMOS circuitry fabricated on the substrate received at operation 105 and the TFTs fabricated at operation 120 are non-planar transistors that may share many architectural features and dimensions. One difference between the two classes of transistors is the channel material. The IC with eDRAM output by methods 101 may then be packaged and/or assembled into a device platform (e.g., computer system) using any known techniques.

Figure 2:
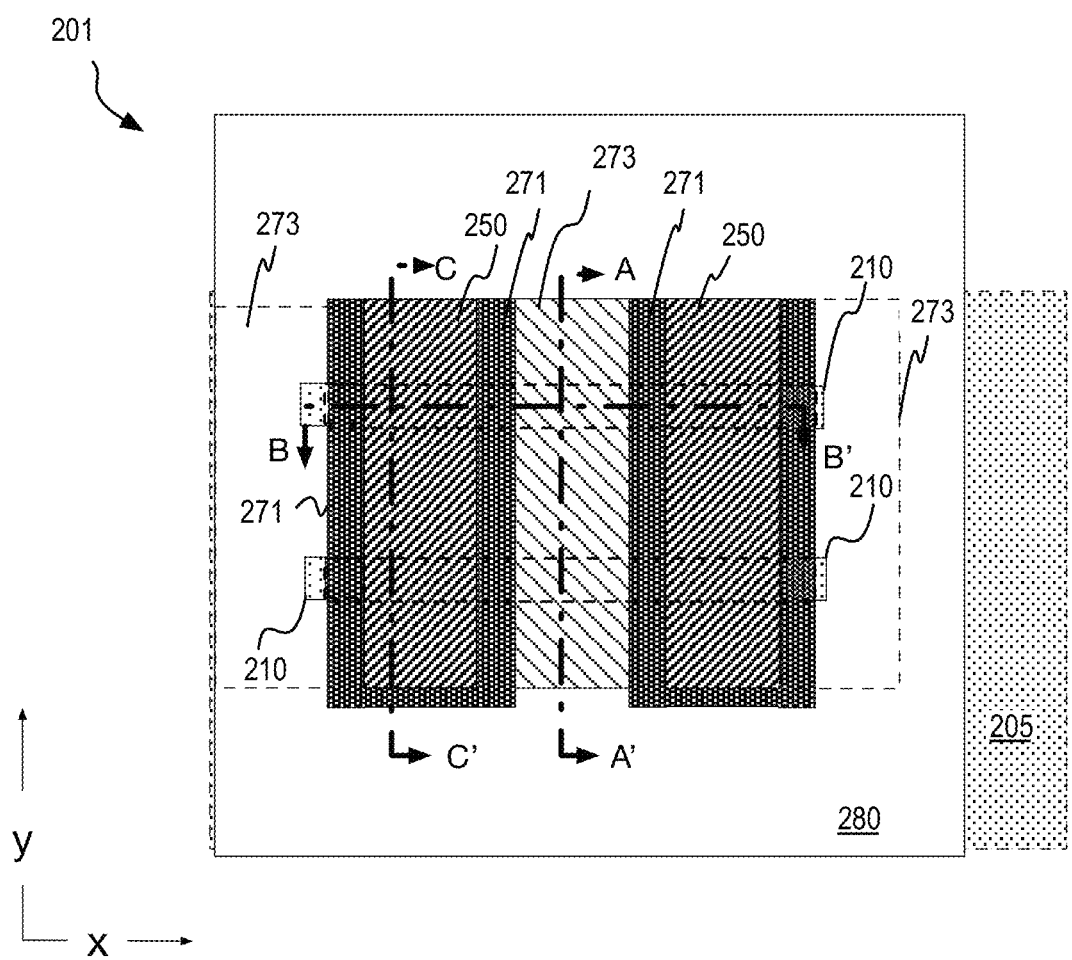
FIG. 2 is a plan view of a non-planar oxide semiconductor TFT structure, in accordance with some embodiments.
Figure 4A:
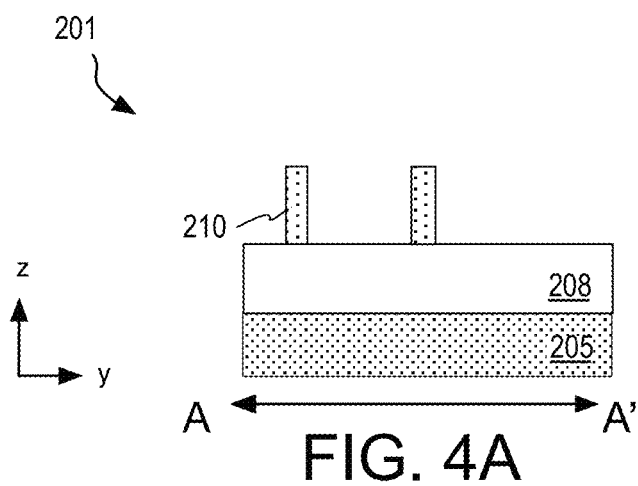
FIGS. 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, and 12A, 12B, 12C are cross-sectional views of a non-planar oxide semiconductor TFT structure evolving as operations in the methods illustrated in FIG. 3 are performed, in accordance with some embodiments.
Figure 4B:
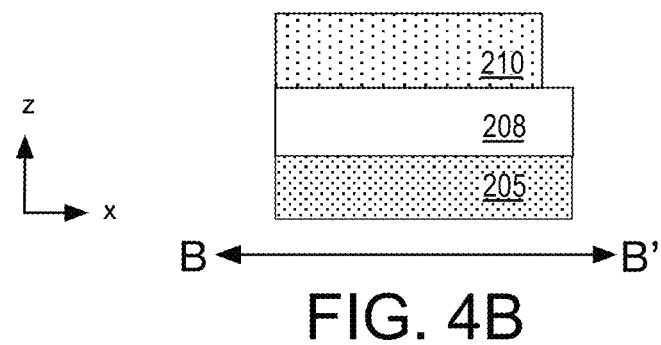
Figure 4C:
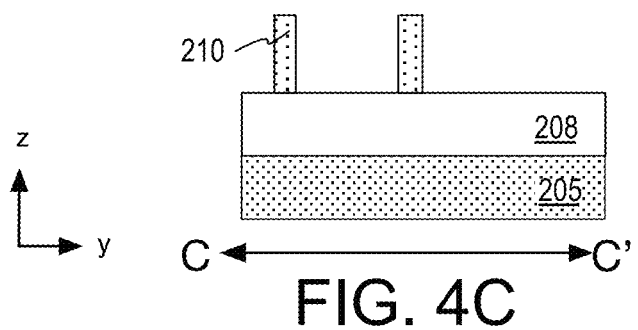

FIG. 2 is a plan view of a non-planar TFT structure 201, in accordance with some embodiments. TFT structure 201 may be fabricated at operation 120 of methods 101 (FIG. 1), for example. In FIG. 2, solid lines within the expanded view of TFT structure 201 denote salient materials and/or features overlying other materials or structural features denoted in dashed lines within a TFT device stratum. As noted elsewhere herein, such a TFT stratum may be integrated within interconnect metallization levels. Heavy dot-dashed lines in FIG. 2 denote planes A-A', B-B' and C-C' along which cross-sectional views are further provided in FIG. 4A, B, C through 12A, B, C, where the letter in the figure number corresponds to the cross-sectional plane in FIG. 2 designated by that same letter.

TFT structure 201 includes a field effect transistor (FET) with a source terminal, a drain terminal, and a gate terminal, in accordance with one illustrative embodiment. In some embodiments, the source and drain terminals include semiconductor having the same conductivity type. In other embodiments, the source and drain terminals include semiconductor having complementary conductivity types (e.g., as employed in a tunnel FET, or TFET). The FET may also include a heterojunction (i.e., HFET). As further shown in FIG. 2, TFT structure 201 is over an underlayer 205. In some embodiments, underlayer 205 includes a substrate upon which TFT structure 201 is fabricated. Non-planar semiconductor bodies 210 are embedded within a surrounding (interlayer) dielectric material 280. TFT structure 201 includes a gate electrode 273 strapping over a channel region of each of a first and a second non-planar semiconductor body 210. Gate electrode 273 therefore is adjacent to two opposing sidewalls of non-planar semiconductor body 210, forming at least two capacitive gating surfaces. Although two non-planar semiconductor bodies 210 are illustrated in FIG. 2, a non-planar TFT in accordance with embodiments herein may include one or more such non-planar oxide semiconductor bodies. For example 1C-1T cells, a non-planar TFT advantageously includes more than one non-planar semiconductor body to achieve a desired drive current.

The channel (region) within semiconductor bodies 210 is located under gate electrode 273 and may have any composition known to be suitable as a TFT channel material. In the exemplary embodiments described in further detail herein, at least the channel within semiconductor bodies 210 includes one or more oxide semiconductor compositions. An oxide semiconductor is a semiconducting oxide. Oxide semiconductors can be advantageous for low temperature transistor fabrication, and can have excellent transistor characteristics offering high carrier mobility, a tunable material band gap and resistivity, and low off-state leakage. Many oxide semiconductors have been studied, initially in the context of discrete rectifiers, and more recently in the context of TFTs for display applications. Examples include metal oxides with a transition metal (e.g., IUPAC group 4-10) or post-transition metal (e.g., IUPAC groups 11-15). In advantageous embodiments, the metal oxide includes at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and mixtures thereof.

The oxide semiconductor within at least the channel of non-planar bodies 210 may be a p-type, n-type, or intrinsic material. A number of oxide semiconductors have been found to be capable of significant electron densities. Some oxide semiconductors have also been found to be capable of significant electron hole densities. Many oxide semiconductors have high defect density nearer the valence band, but display good n-type electrical properties. Some oxide semiconductors have high defect density in the conduction band, but display good p-type electrical properties. In some embodiments, at least the channel of semiconductor bodies 210 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high). In some other embodiments, at least the channel of bodies 210 comprises a zinc oxide ($ZnO_x$), such as Zn(II) oxide, or ZnO. In other embodiments, the zinc oxide is zinc dioxide ($ZnO_2$) or a mixture of ZnO and $ZnO_2$, where x may range between 1 and 2. In some other embodiments, at least the channel of bodies 210 comprises titanium oxide ($TiO_x$), or $SnO_x$. Exemplary oxide semiconductors that may have suitable p-type conductivity include copper oxide ($CuO_x$). In some $CuO_x$ embodiments, at least the channel of bodies 210 is Cu(I) oxide, or $Cu_2O$. In other embodiments, at least the channel of bodies 210 is Cu(II) oxide (CuO) or a mixture of CuO and $Cu_2O$, where x may range between 0.5 and 1. Still other exemplary oxide semiconductor compositions include $NiO_x$.

Oxide semiconductor conductivity type is a function of composition. Although not bound by theory, the basis for n-type conductivity in many oxide semiconductors may be the presence of oxygen vacancies. The presence of other electrically active dopants, such as hydrogen, or one or more metal species, may also serve as a means of tuning the semiconducting properties of the oxide semiconductor. Non-planar bodies 210, or various portions thereof, may be intentionally doped, or not. Compared to intrinsic oxide semiconductor that is not intentionally doped, n-type and p-type oxide semiconductors may have a higher concentration of impurities, such as, but not limited to, one or more group III element, group V element, and/or elemental hydrogen (H). Dopant levels in bodies 210 may be selected to arrive at an optimal threshold voltage associated with gating the oxide semiconductor within the channel and/or for lowest bulk and/or junction resistance within the source/drain region. In some embodiments where bodies 210 comprise $ZnO_x$, the dopants may include In and Ga. In some specific examples, semiconductor bodies 210 are $InGaO_3 (ZnO)_5$, often referred to simply as IGZO.

In some exemplary embodiments, non-planar bodies 210 are compositionally homogeneous with the channel region having the same oxide semiconductor composition as source/drain regions coupling to source/drain contact metallization 250. As such, the TFT channel region is coupled to contact metallization 250 through semiconductor homojunctions. In alternative embodiments, bodies 210 are compositionally heterogeneous between the channel region and at least one of the source/drain regions. The TFT channel region is then coupled to contact metallization 250 through at least one semiconductor heterojunction. In such embodiments, the source and drain ends of semiconductor bodies 210 may both include the same oxide semiconductor having a different composition than the channel region. Alternatively, the source/drain ends may be two different oxide semiconductors, and may also have complementary conductivity types (e.g., where TFT structure 201 is operable as a tunnel FET). While semiconductor bodies 210 may display some level of structural ordering (e.g., nanocrystallinity), in some embodiments amenable to lowest processing temperatures, at least the channel region of bodies 210 is amorphous.

Although only one gate electrode 273 is illustrated in solid line as being part of a single TFT structure 201, exemplary second and third gate electrodes 273 are drawn in dashed line as being associated with adjacent TFT structures. Gate electrode 273 may have any composition known to be suitable for controlling the channel conductivity. Gate electrode 273 may have any suitable work function and may include an elemental metal layer, a metal alloy layer, or laminate structure of either or both. In some embodiments the gate electrode is a metal nitride, such as TiN (e.g., 4.0-4.7 eV). The gate electrode may also comprise Al (e.g., TiAlN). Other alloy constituents may also be employed in gate electrode 273, such as, but not limited to, C, Ta, W, Pt, and Sn. A gate dielectric (not shown in FIG. 2) is located between gate electrode 273 and semiconductor bodies 210. While any gate dielectric materials known to be suitable for semiconductor bodies 210 may be utilized, in some exemplary embodiments the gate dielectric includes at least one layer of a high-k dielectric material (e.g., having a bulk relative permittivity greater than 9). Exemplary high-k materials include metal oxides, such as, but not limited to, $Al_2O_3$, $HfO_2$, and $HfAlO_x$. Silicates, such as, but not limited to $HfSiO_x$, or $TaSiO_x$ may also be suitable as a gate dielectric.

As further illustrated in FIG. 2, source/drain metallization 250 is disposed adjacent to gate electrode 273 and also extends across non-planar bodies 210. In the illustrated embodiment, source/drain metallization 250 is disposed on opposite ends of bodies 210. Source/drain metallization 250 may have any composition known to provide good ohmic characteristics for the chosen composition of semiconductor bodies 210. Source/drain metallization 250 may include, for example, one or more metals or metallic compounds. Source/drain contact metallization 250 may advantageously have a relatively low affinity for oxygen to limit gettering oxygen from oxide semiconductors. In some embodiments, source/drain contact metallization 250 includes a metal nitride at the interface of (i.e., in direct contact with) semiconductor bodies 210. Metal nitrides offer good stability and do not ready oxidize. Exemplary metal nitrides include TiN, TaN, and WN. In other exemplary embodiments, source/drain metallization 250 includes a noble metal (e.g., Pt) at the interface of (i.e., in direct contact with) semiconductor bodies 210. Semiconductor bodies 210 are shown in dashed line as extending under an electrically insulating spacer dielectric 271. Spacer dielectric 271 laterally separates gate electrode 273 from source/drain metallization 250 and/or source/drain ends of semiconductor bodies 210. Spacer dielectric 271 may be any dielectric such as, but not limited to, silicon dioxide, silicon nitride, or silicon oxynitride, or any known low-k material, for example having a relative permittivity below 5.0.

Dimensions of semiconductor bodies 210 may vary with implementation. In some embodiments, a semiconductor body 210 has a transverse width (e.g., y-dimension in FIG. 2) less than 150 nm. In an exemplary embodiment, a semiconductor body 210 has a transverse width of 10-50 nm. A semiconductor body 210 may have any longitudinal length (e.g., x-dimension) as a function of the gate length ($L_g$), dielectric spacer width (e.g., x-dimension in FIG. 2), and width of contact metallization 250. In some embodiments, gate length is less than 100 nm (e.g., 10-100 nm). In some further embodiments, the dielectric spacer has a width less than 20 nm (e.g., 2-20 nm). In some further embodiments, source/drain contact metallization 250 has a width (e.g., x-dimension in FIG. 2) less than 100 nm (e.g., 10-100 nm).

Figure 3:
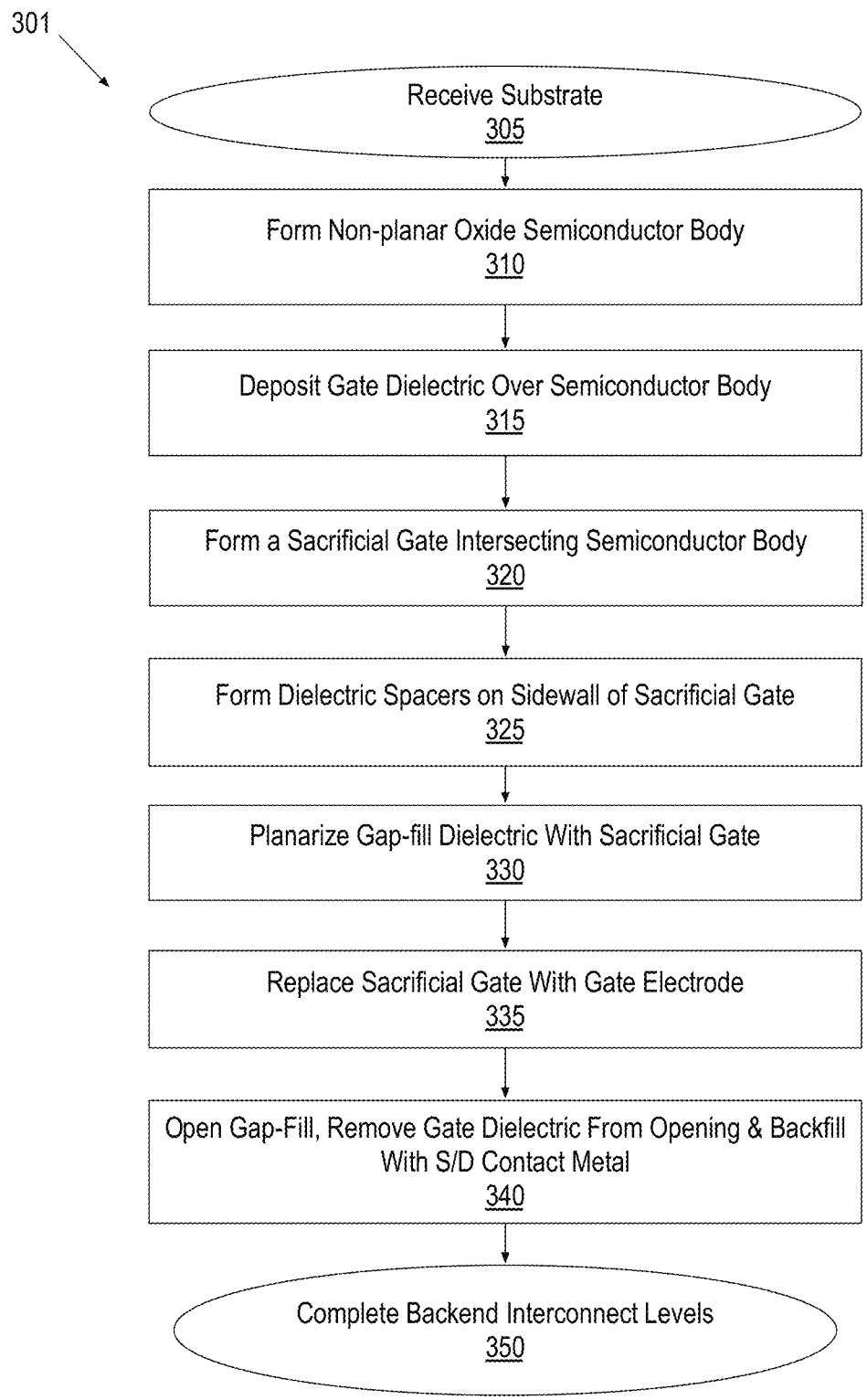
FIG. 3 is a flow diagram illustrating methods for fabricating non-planar oxide semiconductor TFTs, in accordance with some embodiments.

TFT structure 201 may be fabricated with various methods. FIG. 3 is a flow diagram illustrating methods 301 for fabricating non-planar oxide semiconductor TFTs, in accordance with some exemplary embodiments. Methods 301 may be practiced, for example, during operation 120 of methods 101 (FIG. 1) to fabricate non-planar TFT structure 201. FIGS. 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, and 12A, 12B, 12C are cross-sectional views of TFT structure 201 evolving as operations in methods 301 are performed, in accordance with some further embodiments. Various features highlighted in FIG. 4A-12C may be indicative of methods 301.

Referring first to FIG. 3, methods 301 begin with receiving a substrate at operation 305. The substrate received may be any of those described above in the context of operation 105, for example. In some embodiments, the substrate received at operation 305 includes MOSFETs fabricated in a monocrystalline semiconductor device layer. In some embodiments, the substrate received at operation 305 includes capacitors. Such capacitors may have been fabricated in a monocrystalline semiconductor material, or within thin film layers deposited over a monocrystalline semiconductor material, or an alternative material. In an exemplary embodiment, a top layer of the substrate received at operation 305 is a dielectric material, such as, but not limited to silicon dioxide, silicon nitride, or silicon oxynitride, or any known low-k material, for example having a relative permittivity below that of silicon dioxide. Exemplary low-k materials include carbon-doped oxide (SiOCH), MSQ, or HSQ.

Methods 301 continue with forming a non-planar oxide semiconductor body at operation 310. Any additive and/or subtractive processing techniques may be employed at operation 310 to form non-planar oxide semiconductor bodies. In some embodiments, a thin film of oxide semiconductor is deposited over the substrate to a desired thickness. An oxide semiconductor thin film (e.g., comprising IGZO) may be deposited, for example. Such a film may be deposited with a pulsed laser deposition (PLD) process, as one example. The oxide semiconductor thin film may then be masked (e.g., with any photosensitive material), the mask patterned (e.g., with any lithographic techniques known in the art), and the oxide semiconductor thin film patterned by etching away the unmasked portion. The anisotropic etch process may be any known in the art to be suitable for the particular oxide semiconductor composition. In the example further illustrated in FIG. 4A-4C, semiconductor body 210 has been patterned over a low-k interlayer dielectric (ILD) 208. Semiconductor bodies 210 have a height (e.g., z-dimension) that is a function of the thickness of thin film of oxide semiconductor that was deposited. In some embodiments, semiconductor bodies 210 have a height of 20-200 nm.

Returning to FIG. 3, methods 301 continue at operation 315 where a gate dielectric is deposited over the non-planar semiconductor bodies. The gate dielectric may include one or more material layers. The gate dielectric may be deposited by one or more deposition processes, such as, but not limited to chemical vapor deposition (CVD) and atomic layer deposition (ALD). In some embodiments, the gate dielectric is deposited with a low temperature process (e.g., below 350° C.). The deposition technique employed is advantageously conformal, enabling a well-controlled thickness of gate dielectric to be deposited on sidewalls of the semiconductor bodies. Methods 301 continue at operation 320 where a sacrificial gate is formed over the gate dielectric. Any additive and/or subtractive processing techniques may be employed at operation 320 to form sacrificial gates. In some embodiments, a thin film of sacrificial material is deposited over the substrate to a desired thickness. The sacrificial material may be any that can be patterned with high fidelity and subsequently removed with adequate selectivity over the gate dielectric and/or surrounding dielectrics. In some embodiments, the sacrificial material is silicon (e.g., polycrystalline or amorphous). The film of sacrificial material may then be masked (e.g., with any photosensitive material), the mask patterned (e.g., with any lithographic techniques known in the art), and the sacrificial material patterned by etching away the unmasked portion. The etch process may be any known in the art to be suitable for the particular sacrificial material composition.

Figure 5A:
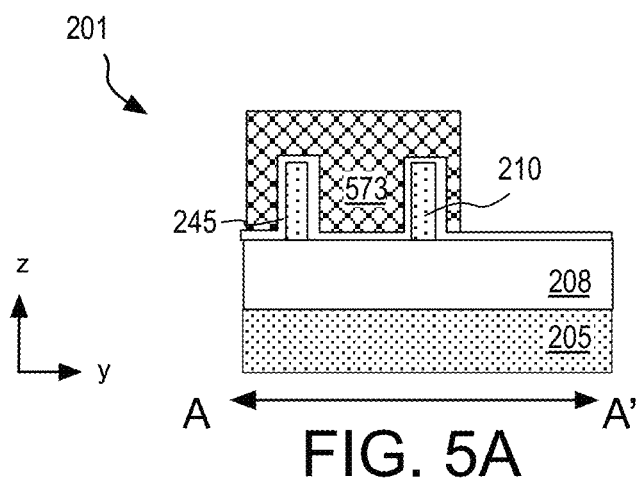
Figure 5B:
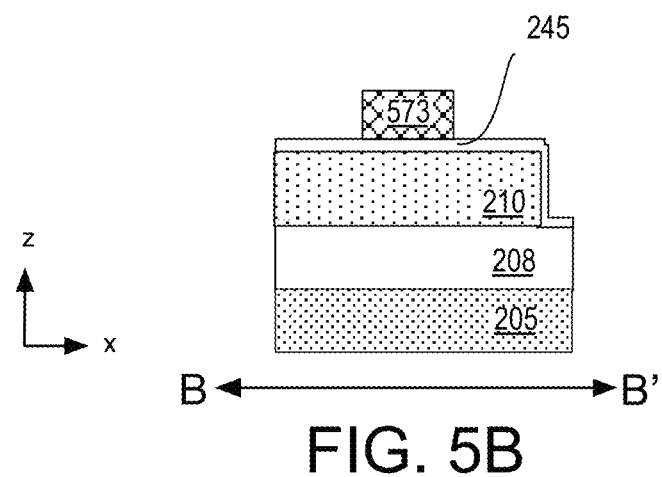
Figure 5C:
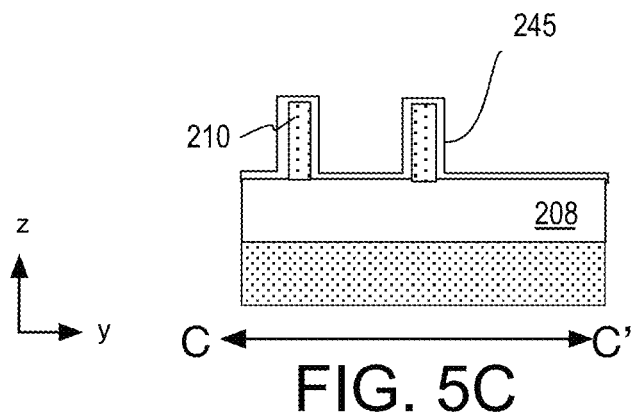
Figure 6A:
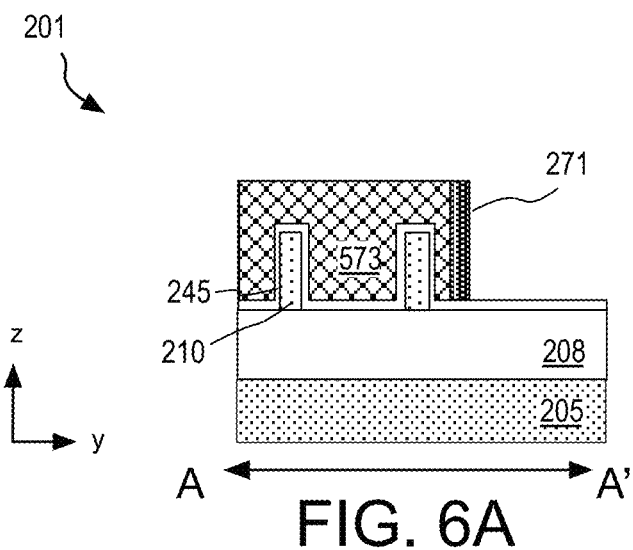
Figure 6B:
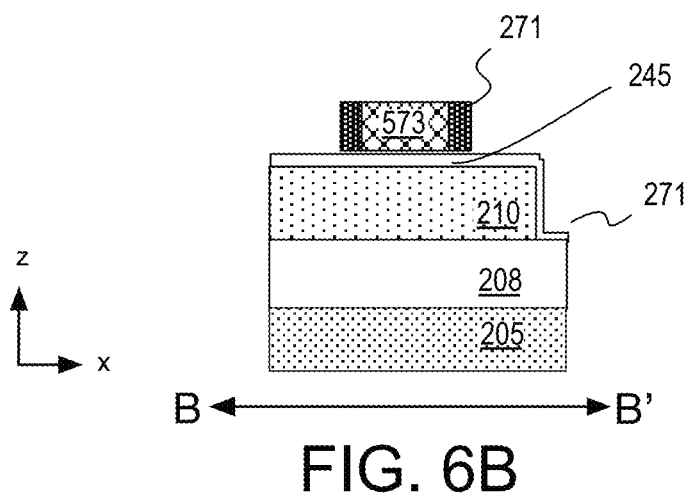
Figure 6C:
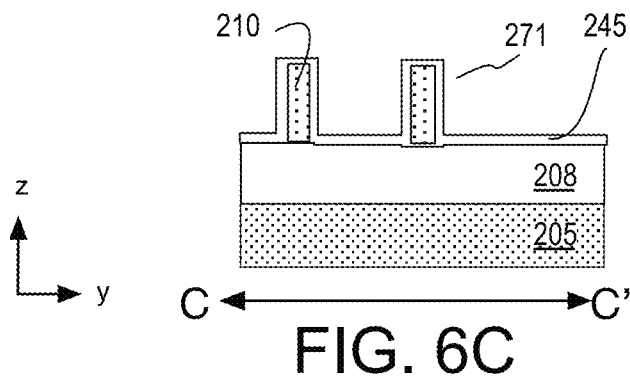
Figure 7A:
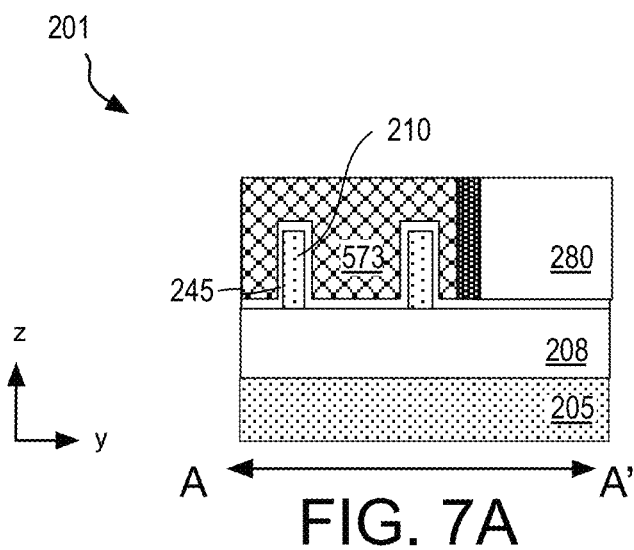
Figure 7B:
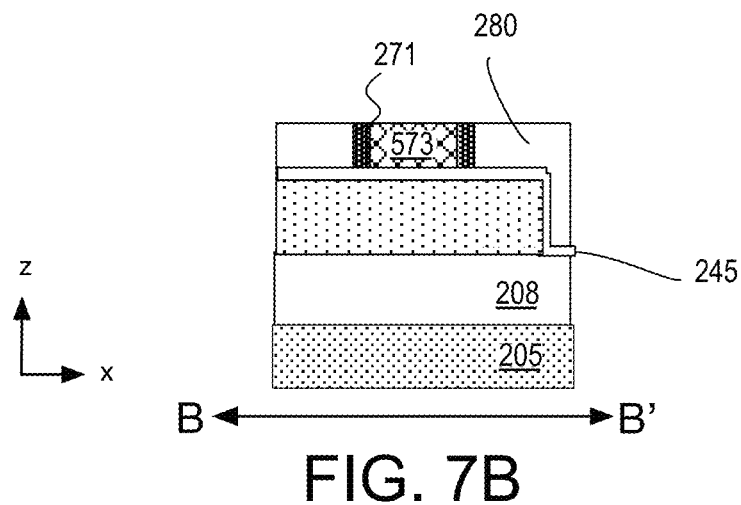
Figure 7C:
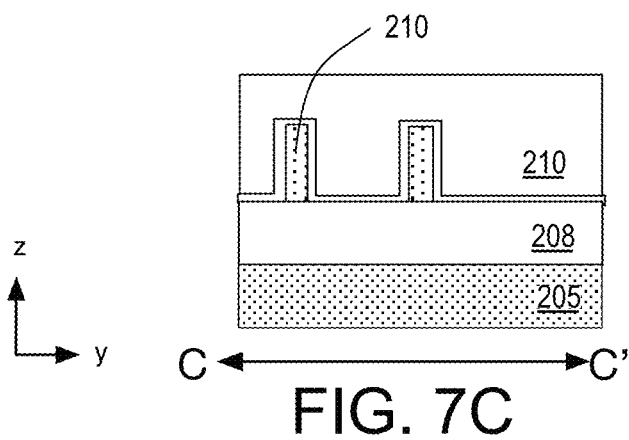

In the example further illustrated in FIG. 5A-5C, gate dielectric 245 (e.g., as deposited at operation 315) is in direct contact with semiconductor bodies 210 and surrounding dielectric 208. In some exemplary embodiments, gate dielectric 245 has a thickness of 2-20 nm. While gate dielectric 245 may include one or more layers of any material known to be suitable as a gate dielectric, in some exemplary embodiments gate dielectric 245 includes at least one layer of a high-k dielectric material, such as any of those described above in the context of FIG. 2. In some advantageous embodiments, gate dielectric 245 includes a high-k dielectric material layer in direct contact with semiconductor bodies 210. Some high-k dielectric materials (e.g., metal oxides) have been found to stabilize oxide semiconductor compositions and may improve compositional homogeneity of an oxide semiconductor relative to oxide semiconductor covered with alternative dielectrics. More specifically, the inventors have found that a dielectric such as SiO, SiN, or SiON, when deposited on an oxide semiconductor, may induce an oxygen-lean or metal-lean composition within a 1-5 nm thickness of the oxide semiconductor (as measured from the gate dielectric interface). Noting semiconducting properties vary with oxide semiconductor composition, non-homogeneity with an oxide semiconductor body may be detrimental to TFT performance. Such non-homogeneity may be particularly detrimental within a channel of the transistor. Sacrificial gate 573 is over gate dielectric 245 and has been patterned to intersect and extend over semiconductor bodies 210. The patterning etch of sacrificial gate 573 has stopped on gate dielectric 245, leaving at least a partial thickness of gate dielectric 245 over other regions of semiconductor bodies 210 and over dielectric 208. In some embodiments where the patterning etch of sacrificial gate 573 does not offer perfect selectivity over gate dielectric 245, the thickness of gate dielectric 245 remaining in regions unprotected by sacrificial gate 573 may be less (e.g., by 1-5 nm) than the thickness of gate dielectric 245 under sacrificial gate 573.

Returning to FIG. 3, methods 301 continue at operation 325 where dielectric spacers are formed along at least a sidewall of the sacrificial gate. Dielectric spacers may be advantageously formed with a self-aligned process that does not rely upon lithographic patterning techniques. In some embodiments, operation 325 entails a deposition of dielectric material and an anisotropic (blanket) etchback of the dielectric material. While the dielectric material deposited may be any known to be suitable for a gate spacer in the context of a FET, in some exemplary embodiments, the dielectric material has a relative permittivity below 5.0. One exemplary compound such as carbon-doped silicon (SiC) may have a dielectric constant above or below 5.0 depending on its specific composition, defect density etc. A compound such as carbon-doped silicon nitride (SiCN) may also have a k value below 5.0, again depending on its specific composition, etc. Some silicon oxynitride (SiON) compositions may also be suitable, depending on their nitrogen content and defect density, for example. Silicon dioxide ($SiO_2$), associated with a k value of 3.9, may also be considered a low-k dielectric in the context of gate spacers. Materials with a relative permittivity below that of silicon dioxide, such as, but not limited to, carbon-doped silicon oxide (SiOC(H)), polyimide, HSQ, or MSQ may also be deposited at operation 325. However, since these materials may be very sensitive to subsequent processing, there use may further entail the deposition of a multi-layered stack, a top layer of which is a higher-k material to protect the an underlayer of sensitive low-k material.

Following dielectric material deposition, any anisotropic etch, such as an anisotropic dry (plasma) etch may be performed to etch through the dielectric material layer(s) with resultant spacers remaining only along topography of sufficient height. The vertical height of the sacrificial gate may, for example, be made greater than the thickness (height) of the semiconductor bodies, to help retain spacers along the sacrificial gate without retaining spacers (at least to the same extent) along sidewalls of the semiconductor bodies. In the exemplary embodiments further illustrated in FIG. 6A-6C, spacer dielectric 271 is shown along the sidewall(s) of sacrificial gate 573 and over gate dielectric 245. The presence of gate dielectric 245 under spacer dielectric 271 may be advantageous for limiting the impact spacer dielectric 271 has on the composition of the underlying oxide semiconductor. Although not illustrated, artifacts of spacer dielectric may be present along sidewalls of semiconductor bodies 210. If so, gate dielectric 245 may be also be present between the semiconductor body sidewall and the spacer artifact. Where the spacer etch process is sufficiently selective to the gate dielectric material, gate dielectric 245 may remain in regions where spacer dielectric 271 has been removed. In some embodiments where the spacer etch does not offer perfect selectivity over gate dielectric 245, the thickness of gate dielectric 245 remaining in regions unprotected by spacer dielectric 271 may be less (e.g., 1-5 nm) than the thickness of gate dielectric 245 protected by spacer dielectric 271.

Returning to FIG. 3, methods 301 continue at operation 330 where the structures formed thus far are planarized with a gap-fill dielectric. Any dielectric material known to have suitable gap filling properties may be employed at operation 330. In some exemplary embodiments, the dielectric material is a low-k material deposited by a gap-filling technique, such as, but not limited to, sub-atmospheric flowable oxide deposition techniques and/or spin-on application techniques. Some exemplary flowable dielectrics are polymers that are subsequently treated with one or more chemical processes and/or thermal processes to cure and densify the dielectric material. If needed, a planarization process (e.g., chemical-mechanical polish) may remove any deposition overburden to planarize a top surface of the sacrificial gate material with a top surface of the surrounding dielectric. In the exemplary embodiments further illustrated in FIG. 7A-7C, dielectric 280 has been planarized with sacrificial gate 573. Dielectric 280 is laterally separated from sacrificial gate 573 by dielectric spacer dielectric 271.

Returning to FIG. 3, methods 301 continue at operation 335 where the sacrificial gate material is replaced with gate electrode material. Gate replacement may entail any subtractive and/or additive processing techniques known in the art. In some embodiments, the sacrificial gate material is removed (etched) selectively to the underlying gate dielectric. In some embodiments, the sacrificial gate material is removed (etched) selectively to the adjacent dielectric spacers. In some embodiments, the sacrificial gate material is removed (etched) selectively to the gap-fill dielectric. Removal of the sacrificial gate material may be by wet chemical or dry (plasma) processing, for example. Gate electrode material may then be backfilled into the resulting openings using any damascene technique(s). In some embodiments, a gate electrode material is deposited with any technique suitable for the material, and deposition overburden removed by CMP to planarize a top surface of the gate electrode material with that of the surrounding dielectric(s).

Figure 8A:
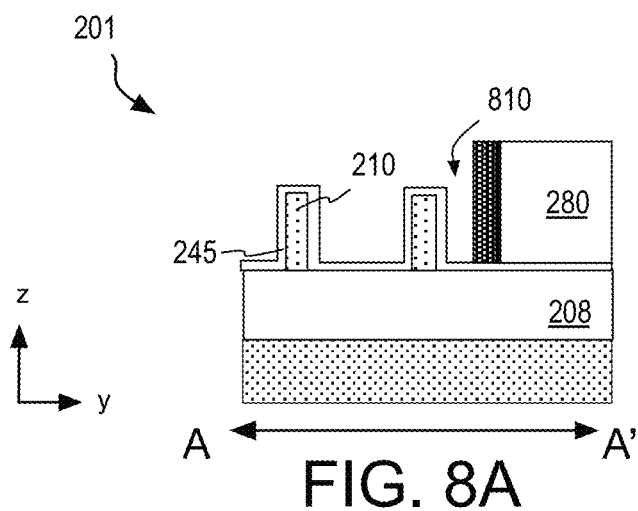
Figure 8B:
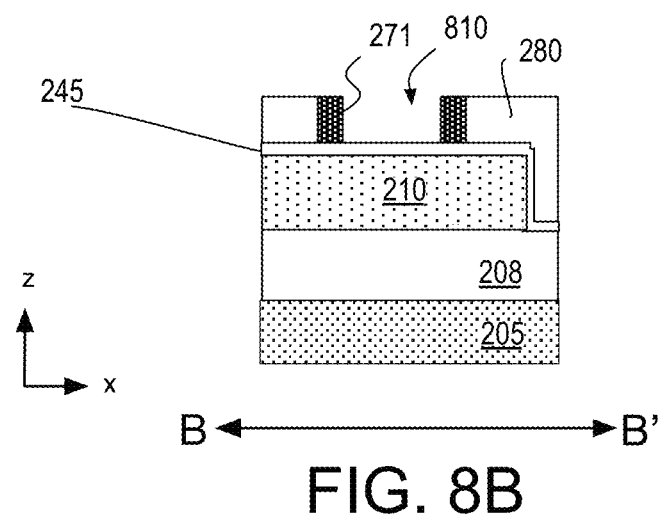
Figure 8C:
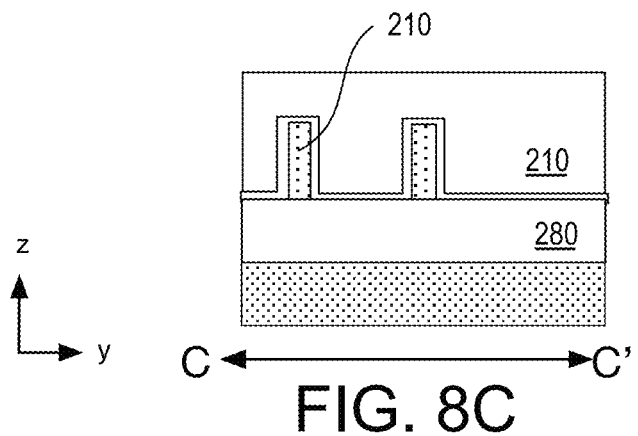
Figure 9A:
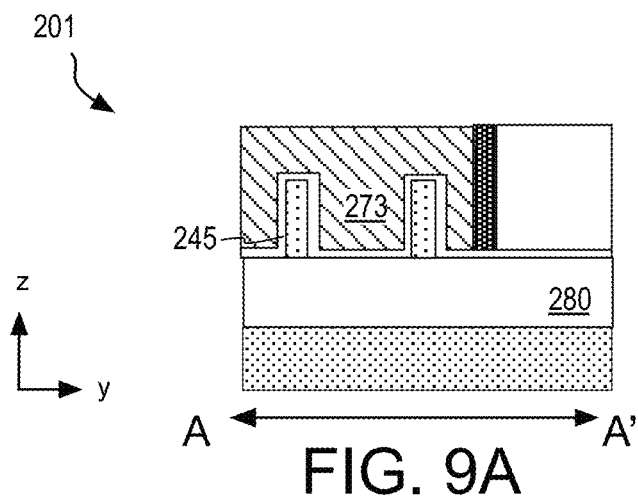
Figure 9B:
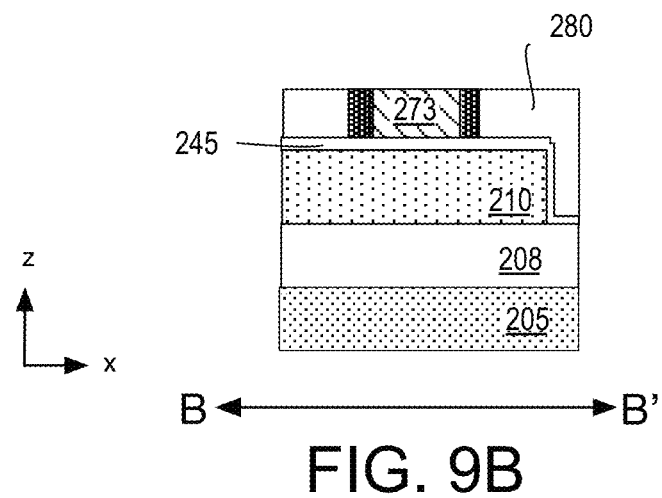
Figure 9C:
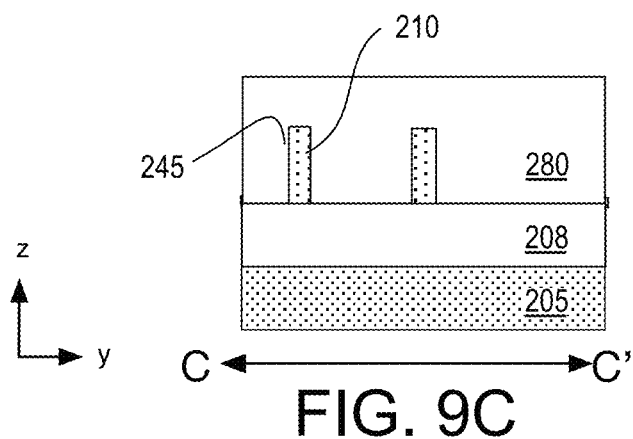
Figure 10A:
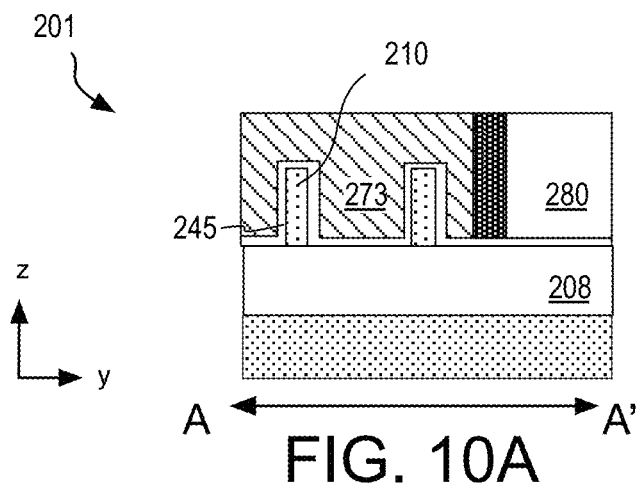
Figure 10B:
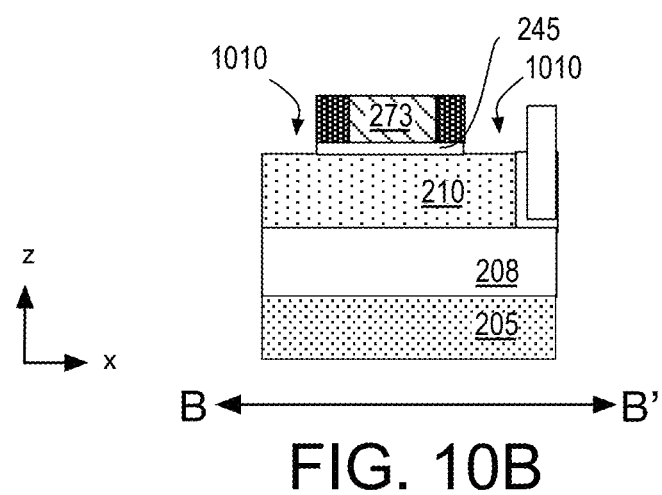
Figure 10C:
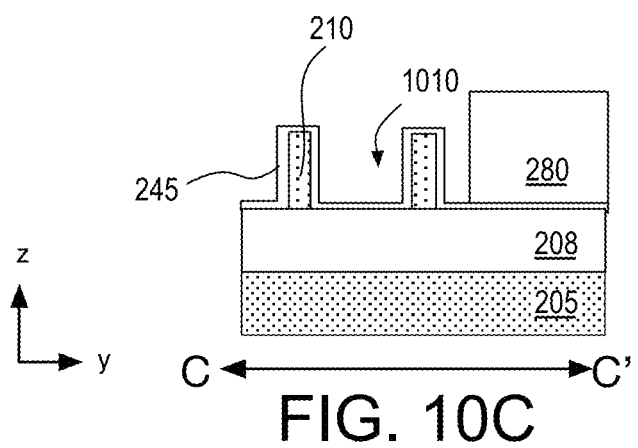
Figure 11A:
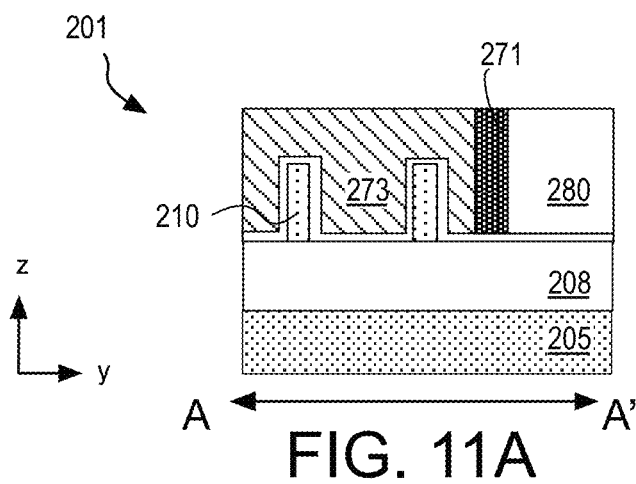
Figure 11B:
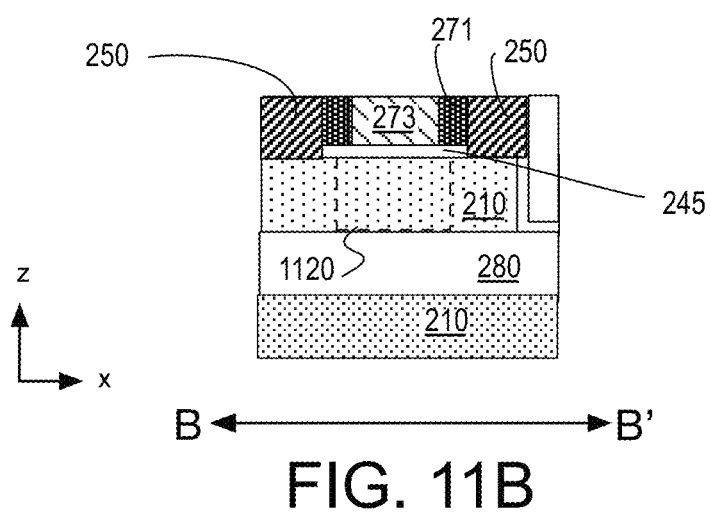
Figure 11C:
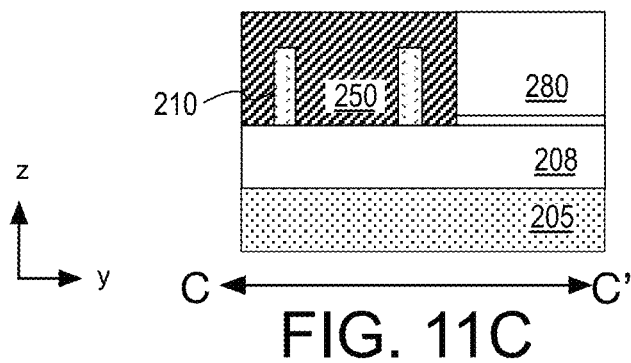
Figure 12A:
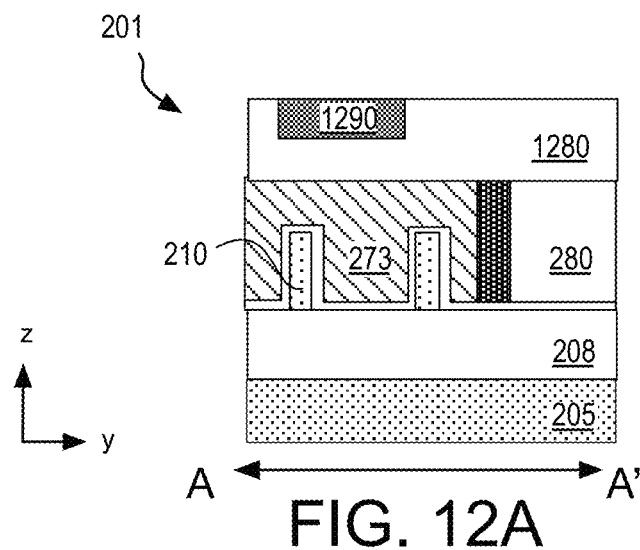
Figure 12B:
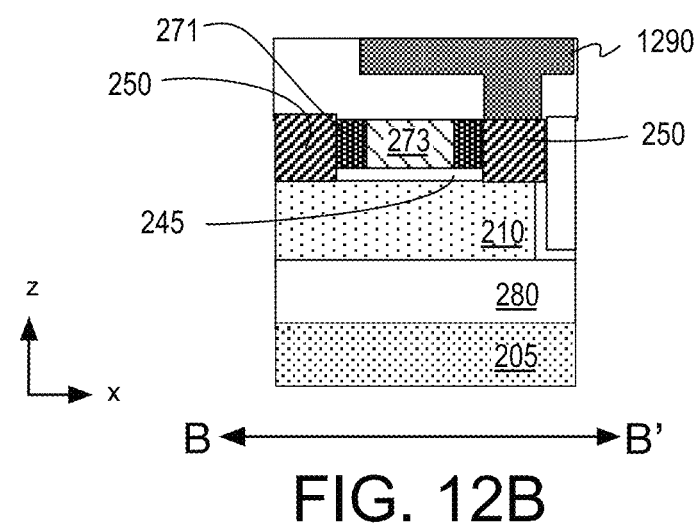
Figure 12C:
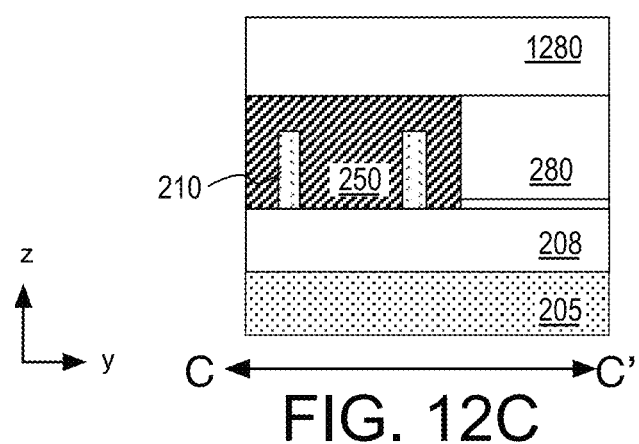

In the exemplary embodiments further illustrated in FIG. 8A-8C, removal of the sacrificial gate material leaves openings or recesses 810. Removal of the sacrificial gate material may be by a process that is more selective to the underlying gate dielectric than is the process employed to initially pattern the sacrificial gate. As such, the thickness of gate dielectric 245 remaining within openings 810 may be thicker (e.g., by 1-3 nm) than gate dielectric 245 located under dielectric spacers 271. In the exemplary embodiments further illustrated in FIG. 9A-9C, gate electrode 273 has been backfilled over gate dielectric 245 and planarized with dielectric 280.

Returning to FIG. 3, methods 301 continue at operation 340 where the gap-fill dielectric is patterned to expose source/drain regions of the oxide semiconductor bodies. In some further embodiments, any gate dielectric remaining within the source/drain openings is also removed. In some further embodiments, any dielectric spacer artifacts remaining within the source/drain openings are also removed. Upon exposing the semiconductor bodies, the source/drain openings are then backfilled with source/drain contact material (e.g., metallization) that may interface with the underlying oxide semiconductor. The backfilling of one or more source/drain contact materials may be by any damascene technique(s), for example. In some embodiments, a contact material is deposited by any technique suitable for the material, and the deposition overburden then removed by CMP to planarize a top surface of the contact material with that of surrounding dielectric(s) and/or gate electrode.

Any additive and/or subtractive processing techniques may be employed at operation 340. In some embodiments, a mask (e.g., of any photosensitive material) is applied, the mask patterned (e.g., with any lithographic techniques known in the art), and the gap-fill dielectric patterned by etching away the unmasked portion. The etch process may be any known in the art to be suitable for the particular dielectric composition. In some embodiments, the gap-fill dielectric is etched at operation 340 with an etch process that is sufficiently selective to the dielectric spacer so as to self-align the contact openings to an outer edge of the dielectric spacer. If the gap-fill dielectric is removed with an etch process that is also selective to the gate dielectric, a subsequent etch of the gate dielectric may be performed with any etch process that will retain the dielectric spacer. Once the gate dielectric is removed, if any small amounts of residual spacer dielectric are present, a short isotropic etch of the spacer dielectric can be performed, for example. In the exemplary embodiments further illustrated in FIG. 10A-10C, following the contact etch process(es), portions of semiconductor bodies 210 are exposed within source/drain openings 1010. In the exemplary embodiments further illustrated in FIG. 11A-11C, contact metallization 250 has been backfilled into the source/drain openings. As shown, spacer dielectric 271 separates contact metallization 250 from gate electrode 273. Such a self-aligned contact (SAC) etch may provide good control over the length of the TFT channel 1120 approximated in dashed line.

Returning to FIG. 3, methods 301 complete at operation 350 with the fabrication of additional interconnect levels, if desired. Such interconnect levels may include traces to electrically couple one or more terminal of the non-planar TFT structures thus far fabricated to one or more electrodes of capacitors, and/or to one or more top-level metallization pads, and/or to one or more terminals of CMOS FETs present in the substrate, and/or to one or more terminals of other TFT structures. Any BEOL interconnect metallization techniques known in the art may be performed at operation 350. In the exemplary embodiments further illustrated in FIG. 12A-12C, interconnect trace metallization 1290 contacts a source/drain metallization 250 and is electrically isolated from other terminals of TFT structure 201 by ILD 1280. Interconnect trace metallization 1290 may be any metal, such as, but not limited to, a Cu-rich metal alloy. ILD 1280 may be any dielectric material known to be suitable for electrically insulating IC interconnects, such as, but not limited to, a low-k ILD material.

Figure 13A:
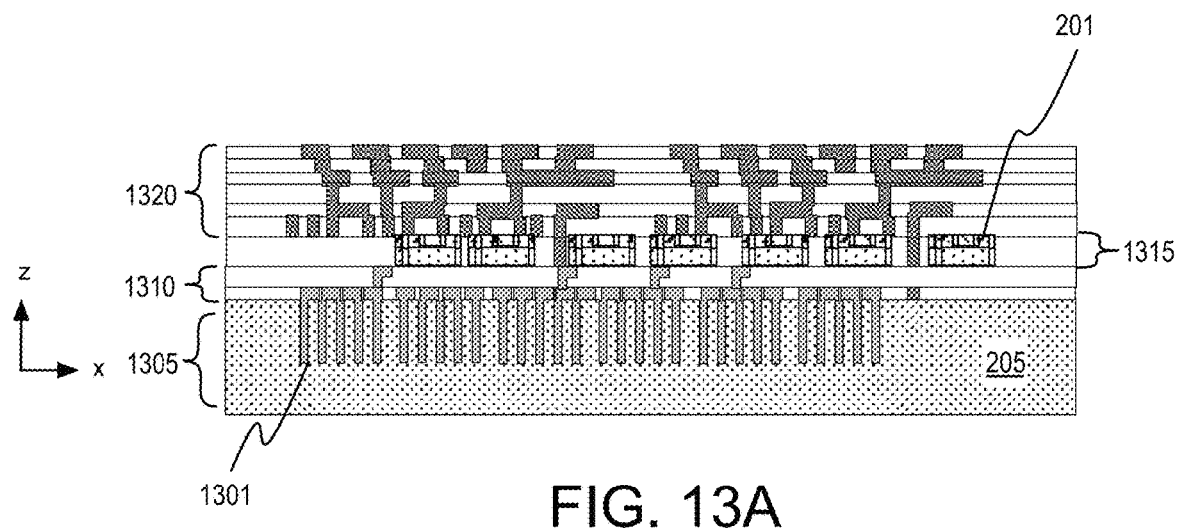
FIGS. 13A and 13B are cross-sectional views of exemplary DRAM devices including a non-planar oxide semiconductor TFT, in accordance with some embodiments.
Figure 13B:
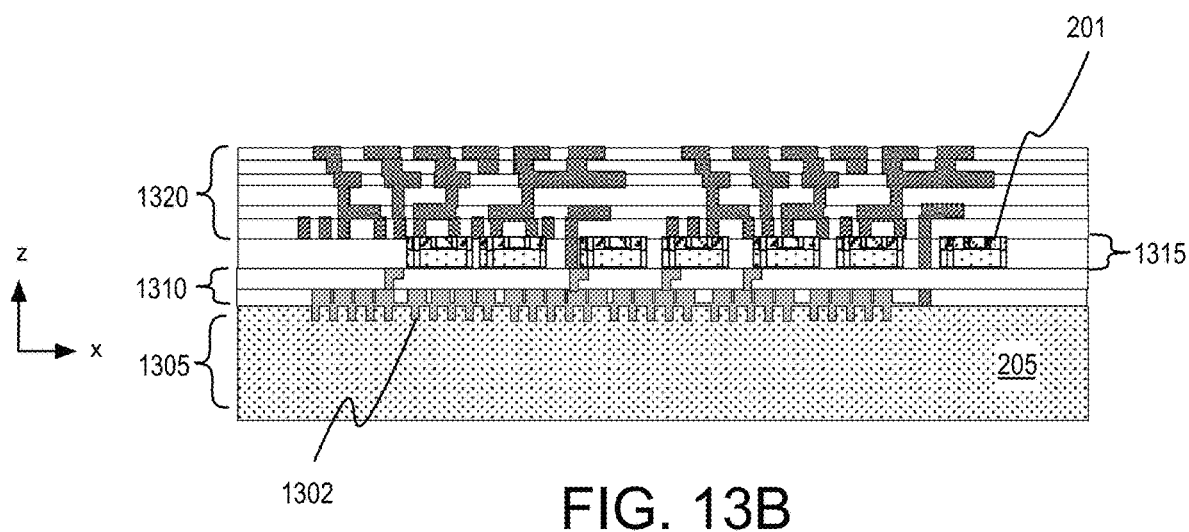

FIGS. 13A and 13B are cross-sectional views of DRAM devices including a non-planar oxide semiconductor TFT, in accordance with some embodiments. The devices show in FIG. 13A, 13B may be fabricated by methods 101 (FIG. 1), for example. The DRAM device shown in FIG. 13A is suitable for a MCM eDRAM application, for example. In FIG. 13A, TFT structures 201 are included within a TFT device stratum 1315 that is integrated between BEOL metallization levels 1310 and BEOL metallization levels 1320. In this exemplary embodiment, capacitors 1301 have been fabricated into underlayer 205. At least one electrode of one or more capacitors 130 are electrically interconnected with at least one terminal of one or more TFT structures 201. The DRAM device shown in FIG. 13B is suitable for monolithic eDRAM application, for example. As shown in FIG. 13B, TFT structures 201 are included within a TFT device stratum 1315 that is integrated between BEOL metallization levels 1310 and BEOL metallization levels 1320. MIM capacitors (not depicted) may be included within one or more metallization levels 1310 and/or 1320. In this exemplary embodiment, silicon-based MOSFET 1302 have been fabricated into underlayer 205. At least one terminal of one or more MOSFETS 1302, and/or one electrode of the MIM capacitors is electrically interconnected with at least one terminal of one or more TFT structures 201.

Figure 14:
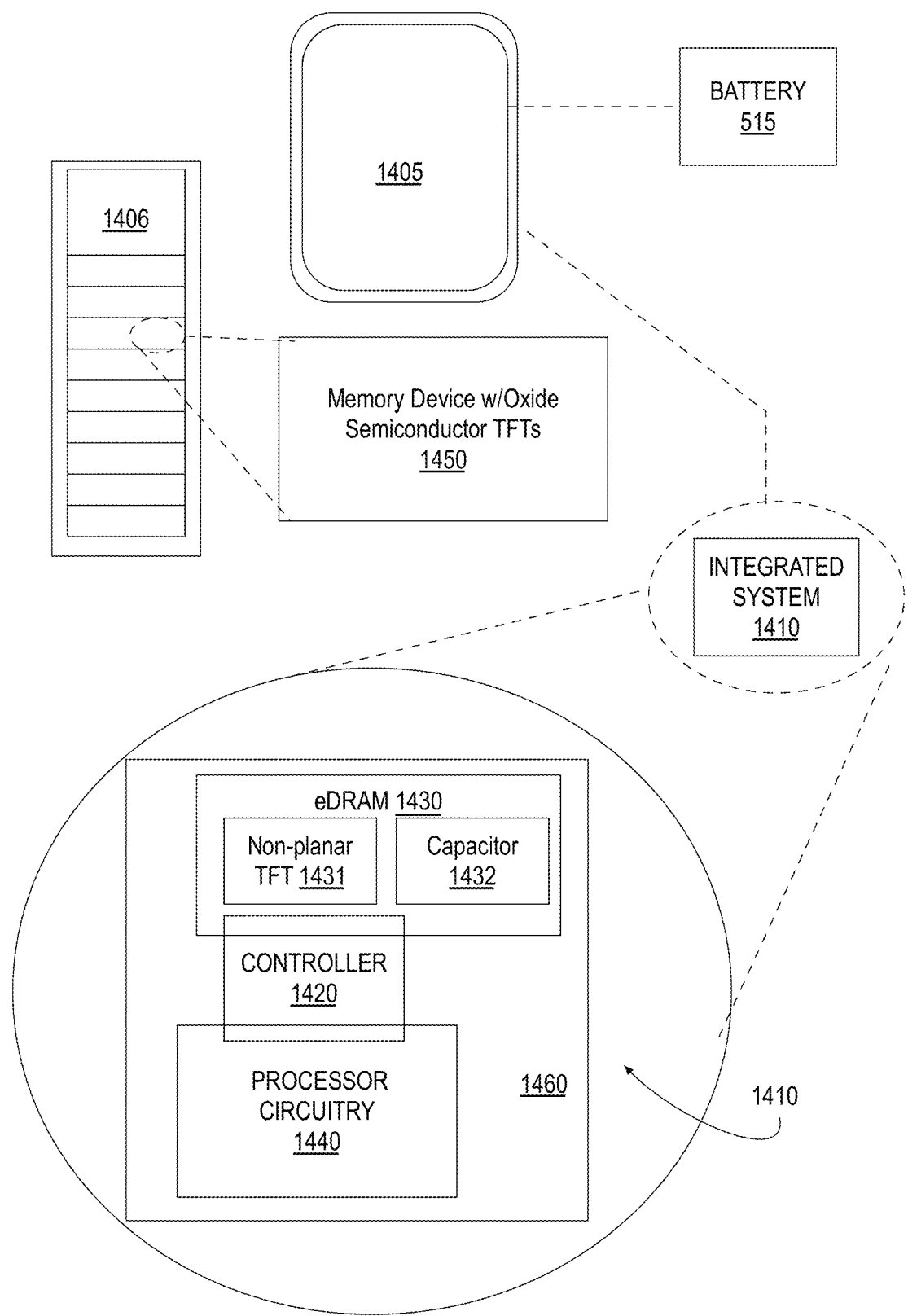
FIG. 14 illustrates a mobile computing platform and a data server machine including a memory device including non-planar oxide semiconductor TFT structures, in accordance with embodiments.

FIG. 14 illustrates a mobile computing platform and a data server machine employing a memory device 1450 including oxide semiconductor TFTs, for example as described elsewhere herein. The server machine 1406 may be any commercial server, for example including any number of high-performance computing platforms disposed within a rack and networked together for electronic data processing, which in the exemplary embodiment includes a packaged monolithic or MCM IC-eDRAM device. The mobile computing platform 1405 may be any portable device configured for each of electronic data display, electronic data processing, wireless electronic data transmission, or the like. For example, the mobile computing platform 1405 may be any of a tablet, a smart phone, laptop computer, etc., and may include a display screen (e.g., a capacitive, inductive, resistive, or optical touchscreen), a chip-level or package-level integrated system 1410, and a battery 1415.

Disposed within the integrated system 1410, a substrate 1460 includes an eDRAM 1430, processor circuitry 1440 (e.g., a microprocessor, a multi-core microprocessor, graphics processor, or the like) and memory controller 1420. eDRAM 1430 includes 1C-1TFT cells, with each cell including a non-planar oxide semiconductor TFT 1431 and a capacitor 1432. For monolithic embodiments, substrate 1460 is a semiconductor chip. For MCM embodiments, substrate 1460 may be any package substrate, or an interposer. Processor circuitry 1440, or a separate RFIC chip may be further coupled to an antenna (not shown) to implement any of a number of wireless standards or protocols, including but not limited to Wi-Fi (IEEE 1402.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 15:
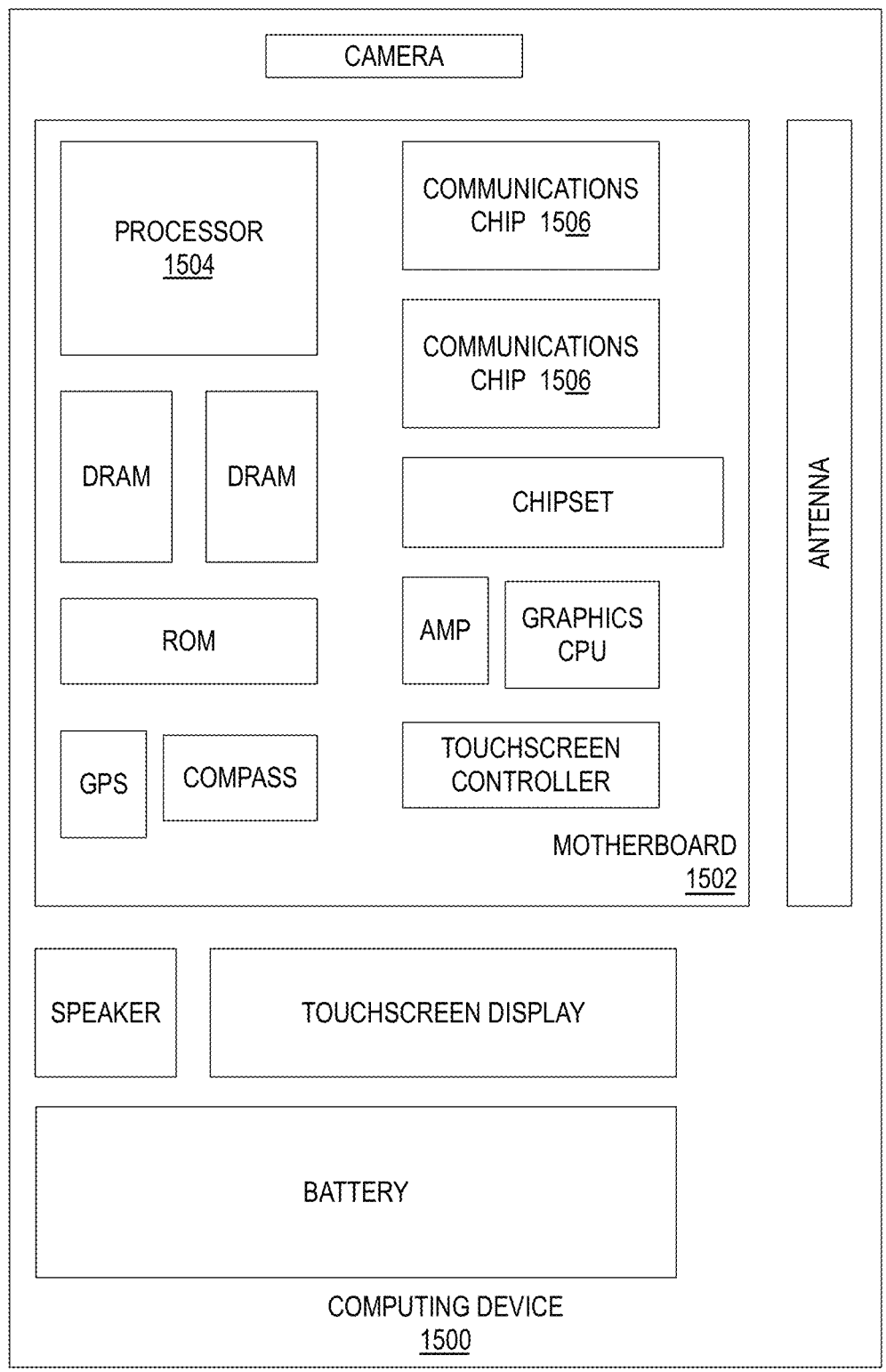
FIG. 15 is a functional block diagram of an electronic computing device, in accordance with some embodiments.

FIG. 15 is a functional block diagram of an electronic computing device, in accordance with some embodiments. Computing device 1500 may be found inside platform 1405 or server machine 1406, for example. Device 1500 further includes a motherboard 1502 hosting a number of components, such as, but not limited to, a processor 1504 (e.g., an applications processor). Processor 1504 may be physically and/or electrically coupled to motherboard 1502. In some examples, processor 1504 includes an integrated circuit die packaged within the processor 1504. In general, the term "processor" or "microprocessor" may refer to any device or portion of a device that processes electronic data from registers and/or memory to transform that electronic data into other electronic data that may be further stored in registers and/or memory.

In various examples, one or more communication chips 1506 may also be physically and/or electrically coupled to the motherboard 1502. In further implementations, communication chips 1506 may be part of processor 1504. Depending on its applications, computing device 1500 may include other components that may or may not be physically and electrically coupled to motherboard 1502, and/or packaged with processor 1504, and/or monolithically integrated with processor 1504. These other components include, but are not limited to, volatile memory (e.g., eDRAM, which may further incorporate at least one oxide semiconductor TFT structure, for example as described elsewhere herein), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1506 may enable wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1506 may implement any of a number of wireless standards or protocols, including but not limited to those described elsewhere herein. As discussed, computing device 1500 may include a plurality of communication chips 1506. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first examples, a thin film transistor (TFT) structure comprises a non-planar semiconductor body having a top surface and a sidewall, the semiconductor comprising oxygen. The structure comprises gate dielectric over at least the sidewall, wherein the gate dielectric comprises a high-k dielectric material. The structure comprises a gate electrode separated from the sidewall of the semiconductor body by the gate dielectric. The structure comprises source and drain contact metallization in contact with portions of the semiconductor body on opposite sides of the gate electrode, wherein the source/drain contact metallization is separated from the gate electrode by a dielectric spacer.

In one or more second examples, for any of the second examples the dielectric spacer is separated from the semiconductor body by at least the gate dielectric.

In one or more third examples, for any of the first or second examples a portion of the gate dielectric between the gate electrode and the semiconductor body has a different thickness than a portion of the gate dielectric between the semiconductor body and the dielectric spacer.

In one or more fourth examples, for any of the first through third examples the portion of the gate dielectric between the gate electrode and the semiconductor body is thicker than a portion of the gate dielectric between the semiconductor body and the dielectric spacer.

In one or more fifth examples, for any of the first through fourth examples the dielectric spacer is in direct contact with both the gate electrode and the source/drain contact metallization.

In one or more sixth examples, for any of the first through fifth examples a top surface of the gate electrode is planar with a top surface of the source and drain contact metallization.

In one or more seventh examples, for any of the first through sixth examples the semiconductor body is over a low-k dielectric material, and portions of the gate dielectric extending beyond the semiconductor body are on the low-k dielectric material.

In one or more eighth examples, for any of the first through seventh examples the gate dielectric comprises a metal oxide.

In one or more ninth examples, for any of the eighth examples the metal oxide comprises at least one of Ti, Al, or Hf.

In one or more tenth examples, for any of the first through ninth examples the semiconductor is selected from the group consisting of: tin oxide; zinc oxide; and titanium oxide.

In one or more eleventh examples, for any of the first through tenth examples the oxide semiconductor comprises IGZO.

In one or more twelfth examples, a memory device, comprises a plurality of metal-insulator-metal capacitors. The memory device comprises a plurality of non-planar thin film transistors (TFTs) electrically interconnected with the capacitors into a plurality of 1T-1C cells. Individual ones of the TFTs comprise a plurality of non-planar semiconductor bodies, individual bodies having a top surface and a sidewall and the semiconductor comprising oxygen. Individual ones of the TFTs comprise a gate dielectric over the bodies and contacting at least one sidewall of the bodies, wherein the gate dielectric comprises a high-k dielectric material. Individual ones of the TFTs comprise a gate electrode separated from sidewalls of the semiconductor bodies by the gate dielectric. Individual ones of the TFTs comprise source/drain contact metallization in contact with portions of the semiconductor bodies on opposite sides of the gate electrode, wherein the source/drain contact metallization is separated from the gate electrode by a dielectric spacer.

In one or more thirteenth examples, for any of the twelfth examples the device comprises one or more levels of metallization over the TFTs, the levels of metallization including one or more trace that electrically connects a source/drain contact metallization of one of the TFTs to an electrode of one of the capacitors.

In one or more fourteenth examples, for any of the twelfth or thirteenth examples the source and drain contact metallization is separated from the gate electrode by only the dielectric spacer, the dielectric spacer in contact with both the gate electrode and the contact metallization.

In one or more fifteenth examples, a method of fabricating a thin film transistor (TFT) structure comprises depositing a semiconductor thin film over a dielectric material, the semiconductor comprising oxygen. The method comprises patterning the semiconductor thin film into a plurality of non-planar oxide semiconductor bodies, individual bodies having a top surface and a sidewall. The method comprises depositing a gate dielectric directly on the semiconductor bodies, wherein the gate dielectric comprises a metal oxide. The method comprises forming a gate electrode over a portion of the semiconductor bodies, the gate electrode separated from the sidewall of the semiconductor bodies by the gate dielectric. The method comprises forming source/drain contact metallization over the semiconductor bodies, the contact metallization separated from the gate electrode by a dielectric spacer.

In one or more sixteenth examples, for any of the fifteenth examples forming the gate electrode further comprises forming a sacrificial gate over the gate dielectric, forming the dielectric spacer along a sidewall of the sacrificial gate, depositing a gap-fill material over the sacrificial gate and the dielectric spacer, planarizing the gap-fill material with the sacrificial gate, removing the sacrificial gate without removing the dielectric spacer, and depositing the gate electrode in an opening generated by removing the sacrificial gate.

In one or more seventeenth examples, for any of the fifteenth through sixteenth examples forming the dielectric spacer further comprises depositing a dielectric material over the sacrificial gate and the gate dielectric, and anisotropically etching the dielectric material into the dielectric spacer, the etching stopping on the gate dielectric.

In one or more eighteenth examples, for any of the fifteenth through seventeenth examples forming the source and drain contact metallization further comprises removing the gap-fill material adjacent to the spacer without removing the dielectric spacer, removing the gate dielectric not protected by the gate electrode, dielectric spacer, or the gap-fill material, depositing the source and/or drain contact metallization, and planarizing the source and/or drain contact metallization with the gate electrode.

In one or more nineteenth examples, for any of the fifteenth through eighteenth examples depositing the gate dielectric further comprises depositing a metal oxide comprising Ti, Al, or Hf onto the sidewall of the semiconductor bodies.

In one or more twentieth examples, for any of the fifteenth through nineteenth examples depositing the semiconductor thin film further comprises depositing an amorphous thin film of tin oxide, zinc oxide, or titanium oxide.

In one or more twenty-first examples, for any of the fifteenth through twentieth examples the method further comprises forming a metal-insulator-metal (MIM) capacitor prior to depositing the semiconductor thin film, or after depositing the source and drain contact metallization, and forming one or more metallization levels interconnecting the TFT to the MIM capacitor.

In one or more twenty-second examples, for any of the fifteenth through twenty-first examples the method further comprises forming a CMOS circuit prior to depositing the semiconductor thin film. Forming the CMOS circuit comprises forming a plurality of n-type fin field effect transistor (finFET) structures and p-type finFET structures, forming one or more metallization levels interconnecting the n-type and p-type finFET structures into the CMOS circuit. The method further comprises forming one or more metallization levels interconnecting the TFT to the CMOS circuit.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A thin film transistor (TFT) structure, comprising:
   a non-planar semiconductor body having a top surface and a sidewall, wherein the semiconductor body comprises a metal and oxygen;
   a gate dielectric over at least the sidewall, wherein the gate dielectric comprises a high-k dielectric material comprising a metal and oxygen and having a relative permittivity greater than 9;
   a gate electrode separated from the sidewall of the semiconductor body by a first portion of the high-k dielectric material having a first thickness between the gate electrode and the semiconductor body;
   source and drain contact metallization in contact with portions of the semiconductor body on opposite sides of the gate electrode; and
   a dielectric spacer laterally separating the gate electrode from the source and drain contact metallization, wherein:
      the dielectric spacer is of a dielectric material having a relative permittivity below 5.0;
      a second portion of the high-k dielectric material is between the semiconductor body and the dielectric spacer; and
      the second portion of the high-k dielectric material has a second thickness, less than the first thickness, separating the dielectric spacer from the semiconductor body.

2. The TFT structure of claim 1, wherein the first portion of the high-k dielectric material between the gate electrode and the semiconductor body is thicker than the second portion of the high-k dielectric material between the semiconductor body and the dielectric spacer by less than 3 nm.

3. The TFT structure of claim 1, wherein the dielectric spacer is in direct contact with both the gate electrode and the source/drain contact metallization.

4. The TFT structure of claim 1, wherein a top surface of the gate electrode is co-planar with a top surface of the source and drain contact metallization, and co-planar with a top surface of the gate dielectric.

5. The TFT structure of claim 1, wherein:
   the semiconductor body is over a low-k dielectric material; and
   portions of the gate dielectric extending beyond the semiconductor body are on the low-k dielectric material.

6. The TFT structure of claim 1, wherein the spacer dielectric material comprises carbon and silicon.

7. The TFT structure of claim 6, wherein the high-k dielectric material comprises at least one of Ti, Al, or Hf.

8. The TFT structure of claim 1, wherein the semiconductor body comprises at least one of tin, zinc, or titanium.

9. The TFT structure of claim 8, wherein the semiconductor body comprises IGZO.

10. A memory device, comprising:
    a plurality of metal-insulator-metal capacitors;
    a plurality of non-planar thin film transistors (TFTs) located over the capacitors and electrically interconnected with the capacitors into a plurality of 1T-1C cells, wherein individual ones of the TFTs comprise—the TFT structure of claim 1.

11. The memory device of claim 10, further comprising one or more levels of metallization over the TFTs, the levels of metallization including one or more traces that electrically connect a source/drain contact metallization of one of the TFTs to an electrode of one of the capacitors.

12. The memory device of claim 10, wherein:
    the source/drain contact metallization is separated from the gate electrode by only the dielectric spacer, the dielectric spacer in contact with both the gate electrode and the contact metallization.

* * * * *